(12) United States Patent
Kirn

(10) Patent No.: US 8,044,715 B2
(45) Date of Patent: Oct. 25, 2011

(54) METHOD AND SYSTEM FOR INCREASING SAMPLING FREQUENCY FOR SWITCHING AMPLIFIERS

(75) Inventor: Larry Kirn, Austin, TX (US)

(73) Assignee: JM Electronics Ltd. LLC, Wilmington, DE (US)

( * ) Notice: Subject to any disclaimer, the term of this patent is extended or adjusted under 35 U.S.C. 154(b) by 53 days.

(21) Appl. No.: 12/524,839

(22) PCT Filed: Feb. 1, 2008

(86) PCT No.: PCT/US2008/052842
§ 371 (c)(1),
(2), (4) Date: Jul. 28, 2009

(87) PCT Pub. No.: WO2008/095181
PCT Pub. Date: Aug. 7, 2008

(65) Prior Publication Data
US 2010/0001794 A1    Jan. 7, 2010

Related U.S. Application Data

(60) Provisional application No. 60/887,662, filed on Feb. 1, 2007.

(51) Int. Cl.
*H03F 3/38* (2006.01)
(52) U.S. Cl. .................. 330/10; 330/251; 330/207 A
(58) Field of Classification Search .................. 330/10, 330/207 A, 251
See application file for complete search history.

(56) References Cited

U.S. PATENT DOCUMENTS

| 5,559,467 A | 9/1996 | Smedley | |
|---|---|---|---|
| 5,663,647 A | 9/1997 | Wirth et al. | 324/322 |
| 6,031,746 A | 2/2000 | Steigerwald et al. | 363/71 |
| 6,150,880 A | 11/2000 | Schweighofer | 330/207 |
| 6,593,807 B2 | 7/2003 | Groves, Jr. et al. | 330/10 |
| 6,967,527 B2 * | 11/2005 | Fukushima | 330/10 |
| 2002/0001342 A1 * | 1/2002 | Berkhout | 375/238 |
| 2010/0102881 A1 | 4/2010 | Kirn | 330/251 |

FOREIGN PATENT DOCUMENTS

| WO | WO 2006/106471 A1 | 10/2006 |
|---|---|---|
| WO | WO 2008/095173 A1 | 8/2008 |

OTHER PUBLICATIONS

K. H. Edelmoser & F. A. Himmelstoss; *"High Dynamic Class-D Power Amplifier"*; Technical University Vienna, Power Electronics Section; Jun. 11, 1997; 1997 IEEE, pp. 302-303.
International Search Report and Written Opinion dated Jun. 10, 2008 for International Application No. PCT/US2008/052842, 9 pages.

* cited by examiner

*Primary Examiner* — Robert Pascal
*Assistant Examiner* — Khiem D Nguyen
(74) *Attorney, Agent, or Firm* — Dorsey & Whitney, LLP

(57) ABSTRACT

The present invention is directed toward providing a system and method of reducing RF interference in switching amplifiers without degrading performance. In one embodiment, the sampling rate of coarse high voltage modulated pulsewidths are increased relative to the sampling rate of fine lower voltage modulated pulsewidths. This increase in the sampling rate of coarse high voltage modulated pulsewidths results in a reduction in EMI.

23 Claims, 3 Drawing Sheets

METHOD AND SYSTEM FOR INCREASING SAMPLING FREQUENCY FOR SWITCHING AMPLIFIERS

CROSS-REFERENCE TO RELATED APPLICATION

This application claims the benefit of International Application No. PCT/US2008/052842, which claims the benefit of U.S. Provisional Application No. 60/887,662, filed on Feb. 1, 2007. The entire disclosure of the prior applications are considered to be part of the disclosure of the instant application and are hereby incorporated by reference therein.

TECHNICAL FIELD

The invention is directed to switching amplifiers and methods, and more particularly, to a system and method for reducing the electromagnetic interference in switching amplifiers.

BACKGROUND OF THE INVENTION

Switching amplifiers enjoy significantly better efficiency than their non-switching predecessors, primarily because transistors used to switch voltages to a load are either turned ON, so that the voltage across the transistor is relatively low, or turned OFF, so that the current through the transistor is relatively low. With either a low voltage across the transistor or a low current through the transistor, the power dissipated by the transistor is relatively low.

Switching amplifiers using a single PWM stream are widely used. However, these switching amplifiers cannot accurately amplify high bandwidth, high accuracy signals at a reasonable cost. A more recent approach has been to use switching amplifiers capable of using modulation techniques that include two or more PWM streams, such as a multi-reference switching amplifier. A multi-reference switching amplifier is described in U.S. Pat. No. 6,535,058 Multi-reference, High Accuracy Switching Amplifier, the entire content being incorporated herein by reference. One example of a multi-reference switching amplifier comprising two separate PWM streams where one stream is a coarse high voltage PWM stream and the other stream is a fine low voltage PWM stream.

Switching amplifiers can sometimes generate excessive electromagnetic radio frequency ("RF") interference that can interfere with the operation of the amplifier as well as with other electronic devices in the vicinity of the amplifier. This RF interference can be attenuated to some extent by coupling the load driven by the amplifier to low pass filters formed by inductors and/or capacitors. A low pass filter attenuates a signal beyond a specific frequency, often called the cutoff frequency. The greater the frequency of the RF interference is above the cutoff frequency, the more the RF interference is attenuated. However, decreasing the cutoff frequency to better attenuate the RF interference limits the bandwidth of the switching amplifier. Conversely, increasing the sampling rate to allow the filter to provide better attenuation of the RF interference reduces the available dynamic range of the output signal, such the ratio of the loudest signal to the smallest signal.

Therefore, there is a need to reduce RF interference without degrading the output signal and without compromising output signal dynamic range.

SUMMARY OF THE INVENTION

The present invention is directed to a system and method of reducing RF interference in a switching amplifier without compromising output signal dynamic range. In one aspect of the invention, a switching amplifier includes a first set of switching devices operable to be coupled to a first voltage and operable to be coupled to a first output filter, and a second set of switching devices operable to be coupled to a second voltage and operable to be coupled to second output filter. The switching amplifier further includes a modulator configured to control the first set of switching devices at a first sampling rate and the second set of switching devices at a second sampling rate to provide first and second voltages to the first and second output filter, respectively, in accordance with the input signal, the first sampling rate greater than the second sampling rate.

DETAILED DESCRIPTION OF PREFERRED EMBODIMENTS

Embodiments of the present invention are directed toward providing a system and method of reducing electromagnetic RF interference in switching amplifiers without degrading performance. Certain details are set forth below to provide a sufficient understanding of the invention. However, it will be clear to one skilled in the art that the invention may be practiced without these particular details.

Figure 1:
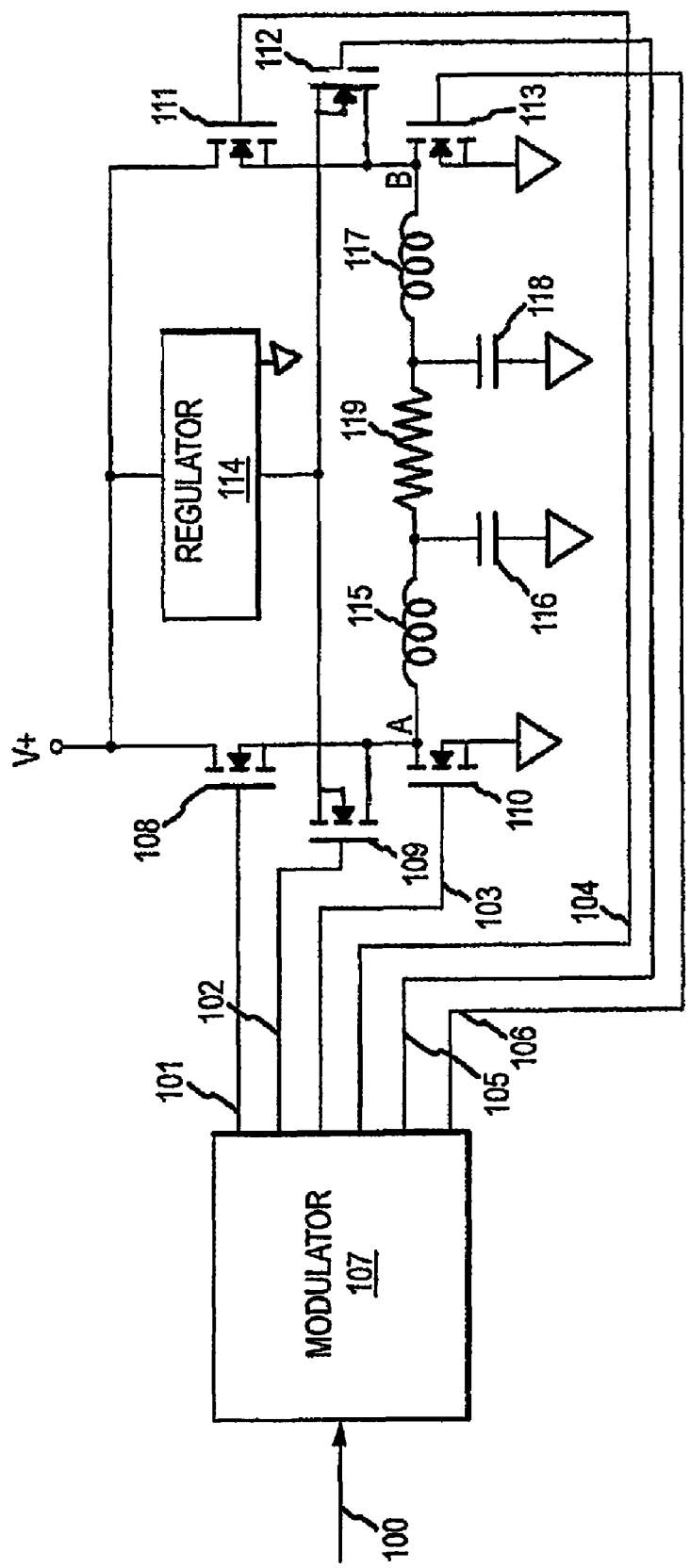
FIG. 1 is a block diagram of a typical multi-reference switching amplifier.

FIG. 1 is a block diagram of a dual reference switching amplifier according to one embodiment of the invention. Although FIG. 1 is directed to a dual reference switching amplifier, a person of ordinary skill in the art would appreciate that the invention applies to any multi-reference switching amplifier. The dual reference switching amplifier of FIG. 1 has two references, positive power supply voltage V+ and the voltage supplied from V+ by a regulator 114. Positive power supply voltage V+ supplies energy to a load 119 through control switches 108, 111. The regulator 114 supplies energy to the load 119 through switches 109, 112. Ground is provided to the load 119 through switching devices 110, 113. In some embodiments, the voltage supplied by the V+ reference is significantly greater than the voltage supplied by the regulator 114. For instance, in one embodiment, the voltage supplied by the positive power supply voltage V+ reference is approximately 12V, and the voltage supplied by the regulator 114 is 47 mV.

Input datastream 100 is applied as input to pulsewidth modulator (PWM) 107, which outputs PWM control signals 101, 102, 103, 104, 105, and 106 to control switching devices 108, 109, 110, 111, 112, and 113, respectively. The load 119 is connected in a bridge configuration across two independent output nodes. A first output node A is through switching devices 108, 109, and 110. A second output node B is through switching devices 111, 112, and 113. The first output node A is coupled to an inductor 115, which is further coupled to a capacitor 116. The inductor 115, in conjunction with the capacitor 116, filters the outputs of switching devices 108, 109, and 110 before applying the outputs to a first terminal of the load 119. The second output node B is coupled to an inductor 117, which is further coupled to a capacitor 118. The inductor 117, in conjunction with the capacitor 118, filters the outputs of switching devices 111, 112, and 113 before applying the outputs to a second terminal of the load 119. Therefore, switching devices 108 and 111 couple the positive power supply V+ to the load 119, and the switching devices 109 and 112 couple the reference voltage supplied from V+ by regulator 114 to the load 119, and switching devices 110 and 113 couple ground to the load 119. The circuit of FIG. 1 is described in further detail in U.S. Pat. No. 6,535,058 referenced above.

The circuit of FIG. 1 results in two separate PWM datastreams on each side of the load 119. In the embodiment shown in FIG. 1, the PWM datastream that is applied to the load 119 through switching devices 108, 111 is a coarse high voltage modulated stream. The pulse width modulated datastream that is applied to the load 119 through switching devices 109, 112 is a fine low voltage modulated stream. However, as will be apparent to a person of ordinary skill in the art, the configuration of the coarse and fine voltage stream is dependent upon which switching devices are coupled to the high voltage source and the low voltage source.

Figure 2:
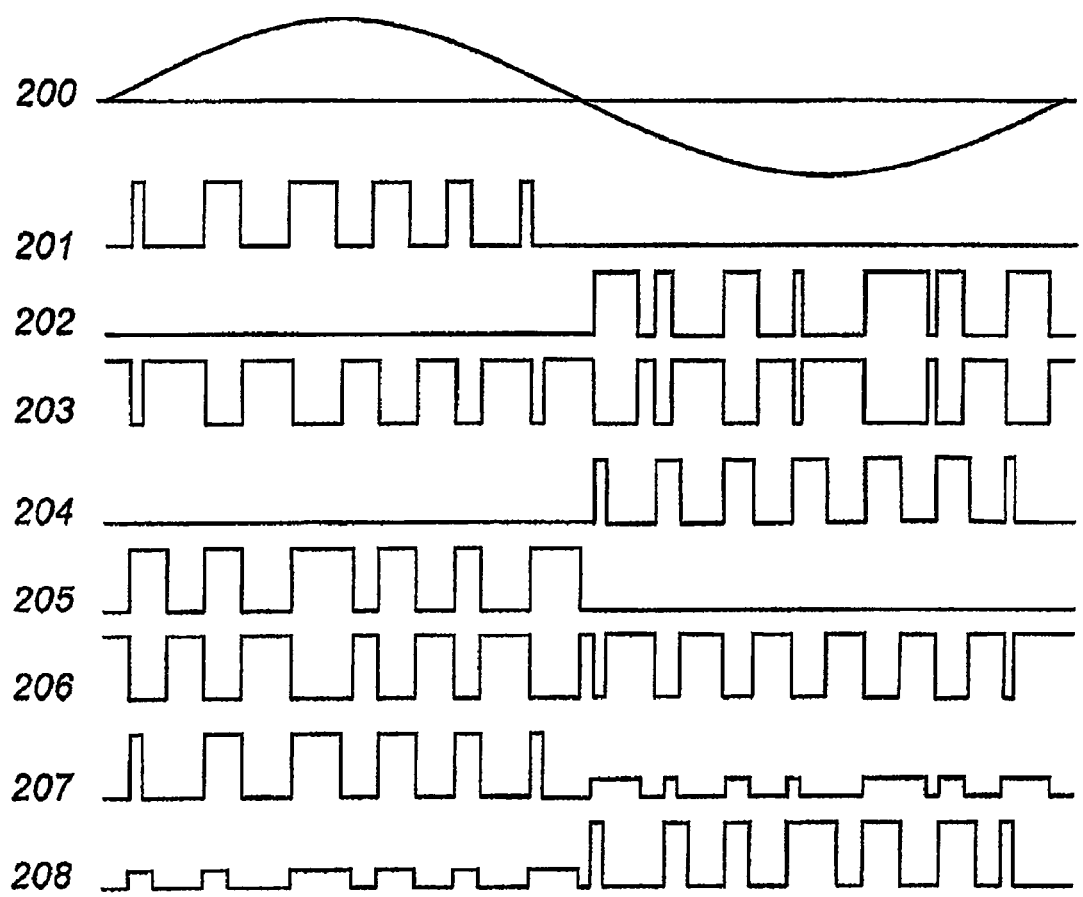
FIG. 2 shows the voltage waveforms typically seen in the circuit of FIG. 1 in accordance with prior art.

FIG. 2 shows the output voltage and current waveforms typically seen in the amplifier of FIG. 1 in accordance with prior art. Trace 200 shows the datastream 100 waveform of FIG. 1 to be amplified. Voltage traces 201, 202, 203, 204, 205, and 206 reflect the states of control signals 101, 102, 103, 104, 105, and 106 of FIG. 1, respectively, as the output polarity to the load 119 in FIG. 1 changes. Voltage trace 207 shows the collective outputs of switching devices 108, 109, and 110, as input to inductor 115 at first input node A. Voltage trace 208 shows the collective outputs of switching devices 111, 112, 113, as input to inductor 117 at second input node B.

As taught by the patent referenced above, note that the high-voltage V+ pulses modulated by coarse data in traces 207 and 208 follow the relative sign shown in trace 200, and that the reference voltage pulses modulated by fine data in traces 207 and 208 follow the opposing relative sign to V+ pulses shown in trace 200. Voltage traces 207 and 208 show that when the V+ pulses modulated by coarse data are applied to one side of the load 119, the reference voltage pulses modulated by fine data are applied to the other side of the load 119. For instance, when switching device 108 provides V+ pulses to the first input node A, switching device 112 provides reference voltage pulses to the second input node B. As is typically done in the prior art to maintain the same voltage on both sides of the load 110, the V+ coarse modulated and reference voltage fine modulated pulses shown in traces 207 and 208 occur at a common fixed output sampling rate.

Figure 3:
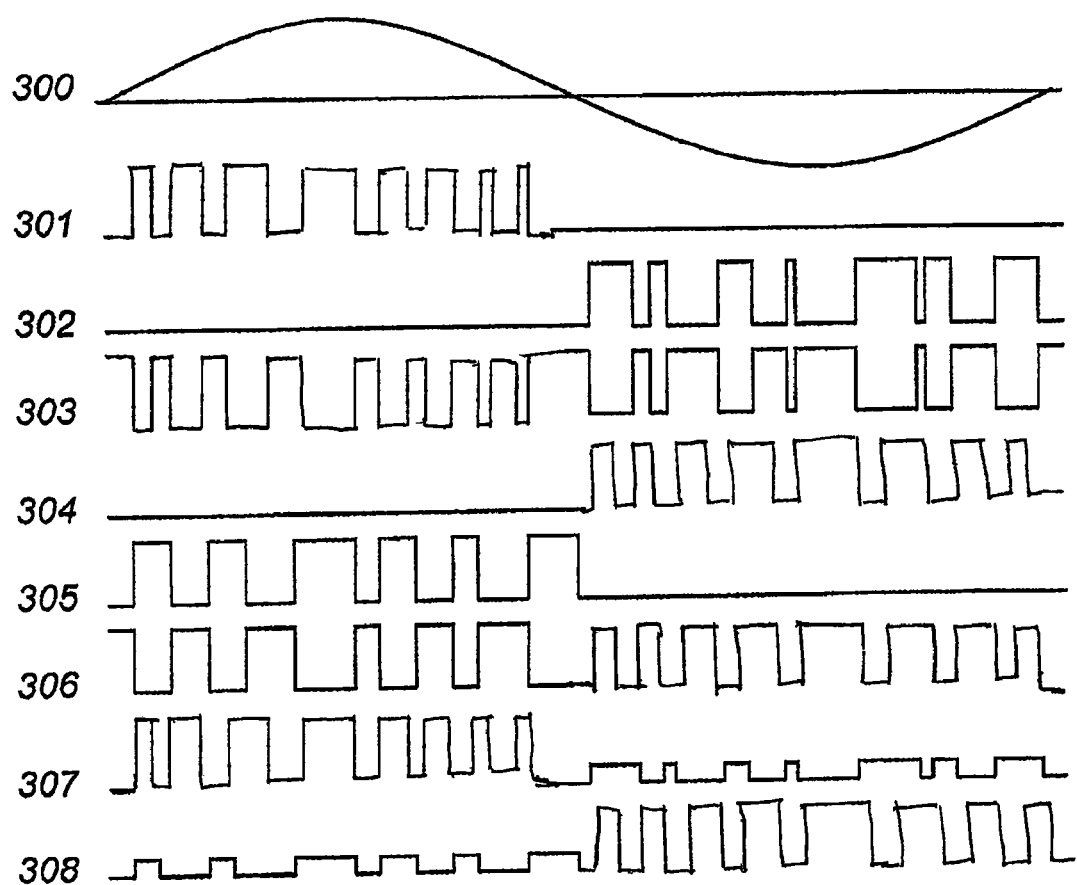
FIG. 3 shows the voltage waveforms of FIG. 1 according to one embodiment of the invention.

According to one embodiment of the invention, the switching amplifier of FIG. 1 is operated as shown in FIG. 3. Trace 300 shows the datastream 100 waveform of FIG. 1 to be amplified. Traces 301, 302, 303, 304, 305, and 306 show signals 101, 102, 103, 104, 105, 106 which control switching devices 108, 109, 110, 111, 112, 113, respectively. Trace 307 shows the collective outputs of switching devices 108, 109, and 110, as input to inductor 115. Trace 308 shows the collective outputs of switching devices 111, 112, 113, as input to inductor 117. Similar to that of FIG. 2, the V+ coarse modulated and the reference voltage fine modulated pulses in traces 307, 308 follow opposing signs of incoming waveform 300.

As can be seen in trace 307, the sampling frequency of the V+ coarse modulated pulses has been increased compared with the sampling frequency of the V+ coarse modulated pulses in trace 207 of FIG. 2. Increasing the frequency of the V+ coarse modulated pulses provides better attenuation of the filter due to operation further from the cutoff frequency. In particular, although the increase in frequency of the coarse high voltage pulses produces greater amplitudes of the RF interference than would lower-frequency operation, second or higher order filters are increasingly capable of attenuating this RF interference at increasing frequency. More particularly, RF interference from high voltage pulsewidth modulation increases no more than six dB as the frequency is doubled, but second order filter attenuation increases as much as 12 dB as the frequency is doubled. Therefore, output filters are able to reduce RF interference without degrading the output signal and without compromising output signal dynamic range. Thus, reducing the RF interference does not compromise performance.

In one embodiment, in addition to increasing the coarse modulated pulses, the length of the pulses are also decreased. For instance, the resultant V+ coarse modulated pulses represented by traces 307, 308 would be one half the length and twice as frequent as the V+ coarse modulated pulses in traces 207, 208 of FIG. 2. The resultant integrals of the traces would therefore be equivalent to the integrals of traces 207, 208 of FIG. 2, but the frequency of emissions would be doubled. In other embodiments, the length of the resultant V+ coarse modulated pulses may be reduced by other amounts, and the frequency of the pulses may be increased by a different rate. However, in one embodiment, the length and frequency of the coarse modulated signals will represent the same output signal to the load 119. As can be seen in traces 307, 308 the output sampling frequency of the reference voltage fine modulated pulses may be undisturbed from those shown in FIG. 2. As will be apparent to those of ordinary skill in the art, the modulator 107 of FIG. 1 will likely require some increased complexity to adjust the sampling rate of the V+ pulses relative to the sampling rate of the reference voltage pulses.

As will be apparent to a person of ordinary skill in the art, the voltage configuration in FIG. 1 may be of another configuration. For instance, in one embodiment, the V+ power supply may be ground and the ground shown in FIG. 1 may be a negative voltage. Another embodiment, however, may include V+ in FIG. 1 as a negative voltage.

By the methods described herein, it can be seen that a reduction in RF interference in multi-reference switching amplifiers may be accomplished without compromising the dynamic range of the output signal.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

What is claimed is:

1. A switching amplifier, comprising:
 a first set of switching devices configured to be coupled to a first voltage source and further configured to be coupled to a first output filter;
 a second set of switching devices configured to be coupled to a second voltage source and further configured to be coupled to a second output filter;
 a third set of switching devices configured to be coupled to a third voltage source; and
 a modulator including an input terminal configured to receive an input signal and further including respective output terminals coupled to individual ones of the first, second, and third sets of switching devices, wherein the modulator is further configured to control the first set of switching devices at a first sampling rate, to control the second set of switching devices at a second sampling rate, and to couple the first and second voltage sources to the first and second output filters, respectively, in accordance with the input signal, and wherein the first sampling rate is greater than the second sampling rate.

2. The switching amplifier of claim 1, wherein the first set of switching devices are further configured to provide coarse control of power to the first output filter, and wherein the second set of switching devices are further configured to provide fine control of power to the second output filter.

3. The switching amplifier of claim 1, wherein the first and second output filters are second order filters.

4. The switching amplifier of claim 1, wherein the first sampling rate is twice the sampling rate of the second sampling rate.

5. The switching amplifier of claim 4, wherein each of the first and second output filters comprise an inductor and a capacitor.

6. The switching amplifier of claim 1, wherein the third set of switching devices are further configured to provide a default voltage state to the load.

7. A switching amplifier, comprising:
  first, second, and third reference voltage sources;
  a first set of control switches, wherein each control switch of the first set is coupled to a respective one of the reference voltage sources and further coupled to a first output filter;
  a second set of control switches, wherein each control switch of the second set is coupled to a respective one of the reference voltage sources and further coupled to a second output filter; and
  a modulator including:
    an input terminal configured to receive an input signal; and
    a first plurality of output terminals coupled to respective ones of the first set of control switches; and
    a second plurality of output terminals coupled to respective ones of the second set of control switches, wherein the modulator is configured to generate a plurality of control signals for the first and second sets of control switches in response to the input signal, and wherein the plurality of control signals are configured to activate the control switches coupled to the first reference voltage source at a higher frequency than the control switches coupled to the second reference voltage source.

8. The switching amplifier of claim 7, wherein the control switches coupled to the first reference voltage source are configured to provide coarse control of power to the first and second output filters, and wherein the control switches coupled to the second reference voltage source are configured to provide fine control of power to the first and second output filters.

9. The switching amplifier of claim 8, wherein the first output filter and the second output filter are both second-order output filters.

10. The switching amplifier of claim 7, wherein a first control switch and a second control switch in the first set of control switches are coupled to the first output filter, and wherein a first control switch and a second control switch in the second set of controls switches are coupled to the second output filter.

11. The switching amplifier of claim 9, wherein each of the first and second output filters comprise an inductor and a capacitor.

12. The switching amplifier of claim 7, wherein the first and second output filters comprise third-order output filters.

13. A method of operating a switching amplifier, the method comprising:
  receiving an input signal at an input terminal of the switching amplifier;
  applying a plurality of first pulsewidth-modulated voltage pulses to a first filter of the switching amplifier during a first period of time; and
  applying a plurality of second pulsewidth-modulated voltage pulses to a second filter of the switching amplifier during the first period of time, wherein a voltage of the first pulsewidth-modulated voltage pulses is greater than a voltage of second pulsewidth-modulated voltage pulses, and wherein the first pulsewidth-modulated voltage pulses are applied to the first filter at a higher frequency than the second pulsewidth-modulated voltage pulses are applied to the second filter.

14. The method of claim 13, further comprising:
  applying a plurality of third pulsewidth-modulated voltage pulses to the first filter of the switching amplifier during a second period of time; and
  applying a plurality of fourth pulsewidth-modulated voltage pulses to the second filter of the switching amplifier during the second period of time, wherein the voltage of the fourth pulsewidth-modulated voltage pulses is higher than the voltage of the third pulsewidth-modulated voltage pulses, and wherein the fourth pulsewidth-modulated voltage pulses are applied to the second filter at a higher frequency than the third pulsewidth-modulated voltage pulses are applied to the first filter.

15. The method of claim 13, wherein the first pulsewidth-modulated voltage pulses coarse control of power delivered to the first filter, and wherein the second pulsewidth-modulated voltage pulses provide fine control of power delivered to the second filter.

16. The method of claim 13, wherein the first and second filters are second-order filters.

17. The method of claim 13, wherein the first filter is coupled to a first side of a load and the second filter is coupled to a second side of the load.

18. The method of claim 17 wherein the load is a speaker.

19. A system, comprising:
  a load; and
  a switching amplifier, including:
    a first set of switching devices configured to be coupled to a first voltage source and further configured to be coupled to a first output filter;
    a second set of switching devices configured to be coupled to a second voltage source and further configured to be coupled to second output filter;
    a third set of switching devices configured to be coupled to a third voltage source; and
    a modulator comprising:
      an input terminal configured to receive an input signal; and
      output terminals coupled to respective ones of the first, second, and third sets of switching devices;
    wherein the modulator is configured to control the first set of switching devices at a first sampling rate and further configured to control the second set of switching devices at a second sampling rate to thereby provide first and second voltages to the first and second output filters, respectively, in accordance with the input signal, and wherein the first sampling rate is greater than the second sampling rate.

20. The system of claim 19, wherein the load is a speaker.

21. The system of claim 19, wherein the first and second output filters are second-order filters.

22. The system of claim 19, wherein the first sampling rate is twice the second sampling rate.

23. The system of claim 19, wherein each of the first and second output filters comprise an inductor and a capacitor.

* * * * *

UNITED STATES PATENT AND TRADEMARK OFFICE
CERTIFICATE OF CORRECTION

PATENT NO. : 8,044,715 B2  
APPLICATION NO. : 12/524839  
DATED : October 25, 2011  
INVENTOR(S) : Kirn Page 1 of 1

It is certified that error appears in the above-identified patent and that said Letters Patent is hereby corrected as shown below:

Column 5, line 4, in Claim 3, delete "second order" and insert -- second-order --.

Column 5, lines 24-25, in Claim 7, delete "signal; and" and insert -- signal; --.

Column 5, line 51, in Claim 10, delete "controls switches" and insert -- control switches --.

Column 6, line 23, in Claim 15, delete "pulses coarse control" and
insert -- pulses provide coarse control --.

Column 6, line 32, in Claim 18, delete "claim 17 wherein" and insert -- claim 17, wherein --.

Column 6, line 40, in Claim 19, delete "to be coupled to second output filter;" and insert
-- to be coupled to a second output filter; --.

Signed and Sealed this  
Twenty-sixth Day of June, 2012

David J. Kappos  
*Director of the United States Patent and Trademark Office*